United States Patent

[11] 3,621,116

[72] Inventor Bertram C. Adams
11370 S.W. 60th Terrace, Miami, Fla. 33143

[21] Appl. No. 888,303
[22] Filed Dec. 29, 1969
[45] Patented Nov. 16, 1971

[54] PRINTED CIRCUIT BOARD
2 Claims, 3 Drawing Figs.

[52] U.S. Cl. .......... 174/68.5, 29/625, 317/101 B, 339/17 R
[51] Int. Cl. .......... H05k 1/02
[50] Field of Search .......... 174/68.5; 317/101 B, 101 C, 101 CM, 101 CC, 101 CX, 101 CW; 29/625, 626; 339/17, 18, 18 C

[56] References Cited

UNITED STATES PATENTS

| | | | |
|---|---|---|---|
| 3,033,914 | 5/1962 | Acosta-Lleras .......... | 174/68.5 |
| 3,179,913 | 4/1965 | Mittler et al. .......... | 174/68.5 X |
| 3,216,089 | 11/1965 | Dettman .......... | 317/101 CW X |

FOREIGN PATENTS

| | | | |
|---|---|---|---|
| 1,126,954 | 4/1962 | Germany .......... | 174/68.5 |
| 469,424 | 4/1969 | Switzerland .......... | 174/68.5 |

*Primary Examiner*—Darrell L. Clay
*Attorney*—Ernest H. Schmidt

ABSTRACT: A printed circuit board for multipurpose use having printed on one face a plurality of parallel circuit tracks each of which is provided along its length with a plurality of enlarged connection stations. The connection stations of the tracks are so placed along their respective tracks as to present a grid pattern along rectangular coordinates. A system of identification indicia printed transversely and vertically along the sides of the grid pattern serves to readily identify any one of the connection stations for easy use of the circuit board in circuit assembly. The track portions between stations are each divided into a plurality of narrow, parallel subtracks to facilitate their severance for open-circuiting as may be necessary in accordance with the particular requirements of a circuit being constructed on the circuit board.

INVENTOR.
BERTRAM C. ADAMS

BY Ernest H Schmidt
ATTORNEY.

PRINTED CIRCUIT BOARD

This invention relates to printed metal circuitry and is directed particularly to a novel and improved multipurpose printed circuit board which will be universally applicable for use in wiring a wide variety of different circuits and, as such, will be particularly well suited to experimental, amateur and prototype electronic and electrical circuit assembly.

The use of printed circuit boards, usually consisting of photochemically or otherwise deposited metallic circuit paths on a thin supporting insulation board member, is well known in the electronics art. Such printed circuit boards are ordinarily designed to suit a particular circuit, and are provided with appropriately placed holes communicating with the circuit paths or tracks through which terminal pigtails and the like of circuit components are threaded and soldered in place, both electrically and mechanically, to provide a compact, mechanically integrated circuit having superior stability and circuit integrity reliability characteristics.

It is the principal object of this invention to provide a printed circuit board for universal application including a plurality of individual circuit paths so symmetrically arranged as to furnish a wide variety of circuit component interconnection possibilities while at the same time providing for efficient and compact use of component space on the board.

It is another object of this invention to provide a printed circuit board for universal use wherein the individual, discrete circuit paths are each provided along their lengths with equidistantly spaced, enlarged connection areas or stations, all of which are so symmetrically arranged with respect to rectangular coordinates as to present a gridlike pattern permitting the use of horizontal and vertical indicia for indexing and thereby precisely locating any one of the individual stations of a particular circuit paths as well as any one of the individual stations of a particular circuit path.

Still another object of the invention is to provide a circuit board of the above nature wherein the connection station coordinate indicia is printed along the sides and across the top and bottom of a circuit board in the same manner and at the same time as the printing of the circuit paths.

Yet another object of the invention is to provide a multipurpose circuit board of the character described wherein the printed circuit track sections interjoining the enlarged connecting stations are in the form of a pair of narrow, parallel conductive track portions rather than a single comparatively wide track. The use of a plurality (two in the illustrated embodiment) of narrow, parallel tracks simplifies the operation of severing tracks for separating circuit path portions in accordance with circuit wiring requirements. Additionally, the possibility of open-circuiting due to a hairline transverse crack occuring in the circuit path is materially reduced, since a crack starting in one of the parallel tracks will not ordinarily continue to fracture its associated track.

Still another object of the invention is to provide a multipurpose circuit board of the above nature wherein the connection stations are not predrilled, as is ordinarily done, but instead are printed with a central circular recess defining the area to be drilled out, when required, to provide for circuit component interconnection. With such construction, the structural rigidity of the insulation board is weakened no more than is necessary by the provision only of those component connection holes required in the particular circuit to be assembled.

Another object of the invention is to provide a universal or multipurpose circuit board of the character described which will be simple and inexpensive to manufacture, which will be neat and compact in appearance, which will have superior reliability as to circuit integrity, which is well adapted to use in the efficient and compact assembly of a wide variety of different electrical or electronic circuits, and which will be easy to use both with respect to selective open circuiting of circuit path portions and the location of interconnection stations in accordance with circuit requirements.

Other objects, features and advantages of the invention will be apparent from the following description when read with reference to the accompanying drawings. In the drawings, wherein like reference numerals denote corresponding parts throughout the several views.

Figures 1, 2:
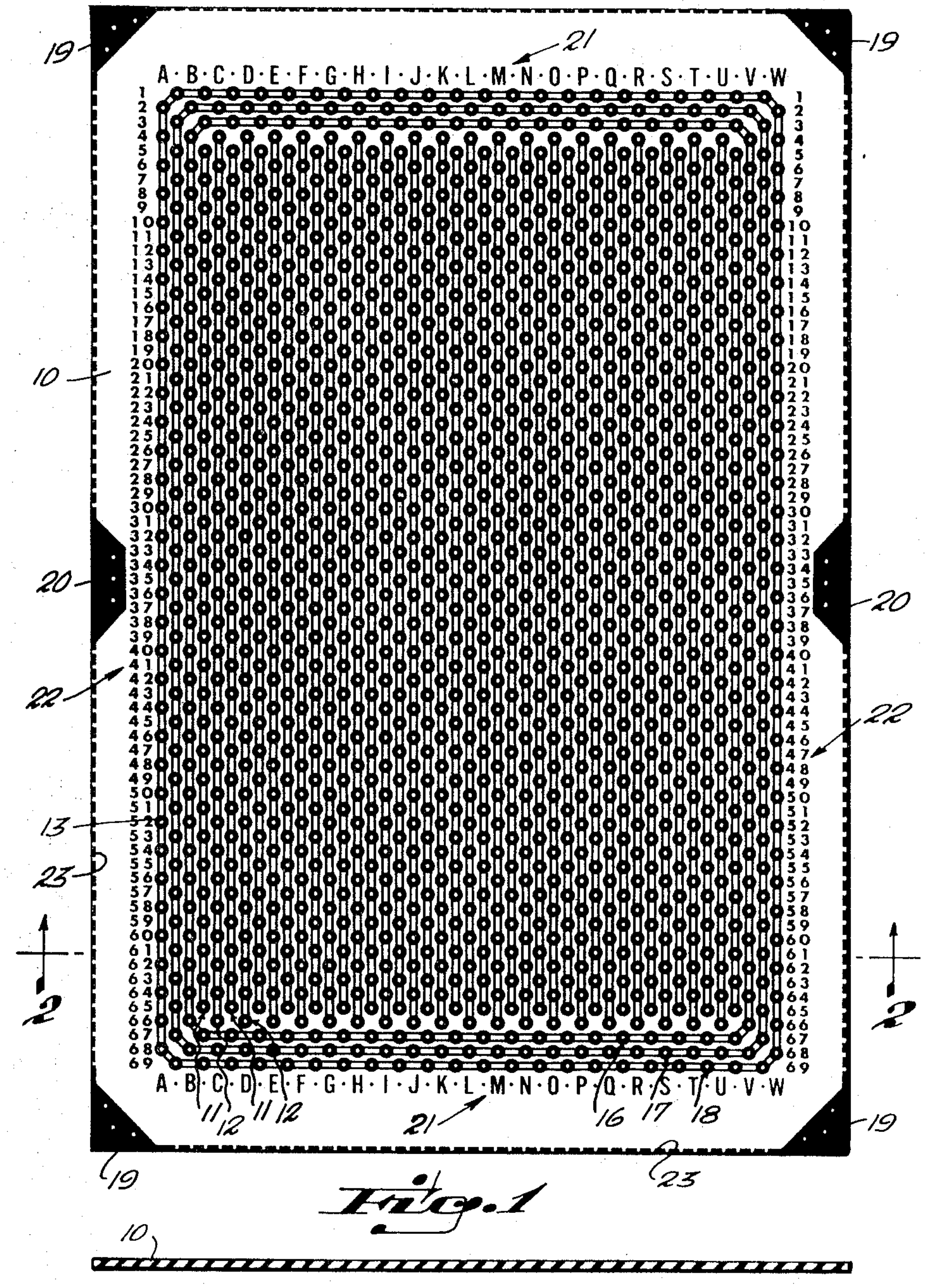
FIG. 1 is a plan view of a printed circuit board embodying the invention.
FIG. 2 is a bottom edge view thereof.
Figure 3:
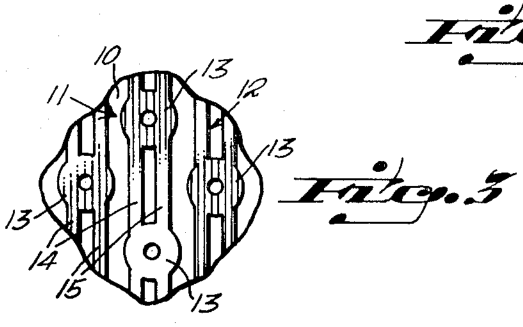
FIG. 3 is a fragmentary plan view of the printed circuit board, on an enlarged scale to illustrate details of the parallel, alternately staggered, individual circuit tracks.

Referring now in detail to the drawings, reference numeral 10 designated an insulation board on which the metal circuitry is printed, said board preferably being comprised of a tough synthetic plastic, electrically nonconductive material, and preferably being rectangular in shape. Photochemically or otherwise printed upon one face of the insulation board 10, (the underside when in use with components on top), are a first set of equidistantly spaced, parallel, longitudinal circuit tracks 11, interspaced by a second set of parallel longitudinally extending tracks 12. Each of the individual tracks 11 and 12 has equidistantly spaced therealong a plurality of annular solder or connection stations 13, the outer diameters of which are of substantially greater size than the overall width of the track sections between said solder stations. As best illustrated in FIG. 3, the track sections between the solder stations 13 of the track sets 11 and 12 comprise spaced, parallel conductive track portions 14 and 15 defining, with their adjacent solder stations 13 a substantially rectangular, nonconductive intermediate zone.

In addition to the above-described first and second longitudinal circuit track sets 12, 13, the circuit board is also printed with inner, intermediate and outer peripheral circuit tracks 16, 17 and 18, respectively, of identical construction with that of said track sets and so spaced and disposed with respect to their annular solder stations as to conform to the grid pattern defined by the annular solder stations of said longitudinal track sets.

The insulation board 10 is also printed with triangular, corner, ground and/or mounting plate sections 19 and, along longitudinal marginal side portions thereof, with opposed, central, ground and/or mounting plate sections 20.

Means is provided for readily identifying any one of the annular solder stations 13 of the printed circuit board. To this end, a rectangular coordinate system of identification comprising numerals 1 through 69 printed along each side of the circuit tracks grid defined by the solder stations 13 and identifying the individual transverse rows of said solder stations, and Letters A through W printed transversely across the top and bottom of said grid and identifying, from left to right, every other individual longitudinally extending row of said solder stations, is provided. It is to be noted that the identifying indicia comprising the numerals 1 through 69 and the Letters A through W can readily be printed on the circuit board along with the printing of the above-described circuit tracks. It will also be noted that the Letters A through W identify every other vertical row of annular solder stations 13 because of space limitations and legibility requirements, with the understanding that in-between vertical rows, such as the vertical row between reference Letters C and D, will be referred to as row CD. With this system of identification, any individual one of the annular solder stations 13 comprising the circuit board grid can readily be located.

The circuit board 10 is also preferably printed with a broken line peripheral edge marking 23 serving as guide lines for cutting a plurality of circuit boards printed on a larger insulation board in a single printing process.

In use, the central circular unprinted zones of the annular solder stations 13 are utilized to index the point of a drill for drilling a through hole wherever a circuit component pigtail, wire jumper or the like is to be connected. It will be noted that the staggered pattern of the individual solder stations 13 of the spaced circuit tracks presents a compact grid pattern providing for a wide variety of possible arrangements of circuit parts on the board. The use of two comparatively narrow circuit track portions 14 and 15 between the individual solder stations 13 not only simplifies the severing thereof into discrete track subsections in accordance with circuit requirements, but also, as hereinabove described, reduces the possibility of open circuiting wherever circuit track integrity is to be maintained in the event a transverse hairline crack occurs. The narrowness of the tracks, moreover, permits their being readily severed, when required, by the use of a cutting blade, snipping with the points of a small wire cutter or by use of a small grinding tool.

While I have illustrated only one side of the circuit board as being printed with conductive tracks, I contemplate that the reverse side could also be printed, preferably with tracks running perpendicular to those of the opposite side and with connection stations in register with the connection stations of the opposite side to facilitate jumper connection from track to track in accordance with circuit requirements. It is also to be noted that while I have illustrated the individual circuit track sections between solder or connection stations as being comprised of two spaced narrow-track portions, they could as well be subdivided into three or more narrower track portions without departing from the concepts of the invention.

My invention, in brief, comprises all the embodiments and modifications coming within the scope and spirit of the following claims.

What I claim is new and desire to secure by Letters Patent is:

1. A printed circuit board for multipurpose use, comprising, in combination, a thin, flat insulation board member, a plurality of longitudinally extending, mutually parallel, electrically conductive circuit tracks printed on one face of said insulation board member, each of said circuit tracks being provided along its length with a plurality of spaced connection stations of increased width, the circuit track sections between said connection stations each being comprised of a plurality of narrow, spaced, parallel track portions, the connection stations of said parallel circuit tracks being so arranged therealong as to present a uniform grid of track stations, a first set of indicia printed in a vertical row on said insulation board to identify individual horizontal rows of said connection stations, and a second set of indicia printed in a horizontal row on said insulation board to identify individual vertical rows of said connection stations, said first and second sets of indicia comprising means for any one of said connection stations by rectangular coordinates, and a plurality of closed-circuit peripheral tracks printed on said insulation board member surrounding said plurality of longitudinally extending tracks and being of the same construction thereas, the connection stations of said peripheral tracks conforming in their placement to said uniform grid presentation of said longitudinally extending tracks.

2. A printed circuit board for multipurpose use comprising, in combination, a thin, flat insulation board member, a first plurality of longitudinally extending, electrically conductive circuit tracks printed in mutually parallel, equidistantly spaced disposition on said insulation board member, said first plurality of circuit tracks being provided, along their lengths, with a plurality of equidistantly spaced connection stations of increased width, a second plurality of longitudinally extending, mutually parallel circuit tracks printed on said insulation board in centrally spaced relation between said first plurality of tracks, said second plurality of circuit tracks being provided along their lengths with a plurality of equidistantly spaced connection stations of increased width, the circuit track sections between said connection stations each being comprised of a plurality of narrow, spaced, parallel track portions, the connection stations of said second plurality of circuit tracks being staggered between the connection stations of said first plurality of tracks to define, together with the connection stations of said first plurality of tracks, a uniform grid of track stations, a first set of indicia printed in a vertical row on said insulation board to identify individual horizontal rows of said connection stations, and a second set of indicia printed in a horizontal row on said insulation board to identify individual vertical rows of said connection stations, said first and second sets of indicia comprising means for identifying any one of said connection stations by rectangular coordinates, said connection station being of annular shape defining a circular, central, nonconductive zone serving as a locating point for a drilling operation when required for circuit connection thereto, one of said indicia sets comprising a sequence of numerals and the other of said indicia sets comprising a sequence of alphabetical letters, and a plurality of closed-circuit peripheral tracks printed on said insulation board member and surrounding said first and second pluralities of longitudinally extending tracks and being of the same construction thereas, the connection stations of said peripheral tracks conforming in their placement to the uniform grid presentation of said first and second pluralities of tracks.

* * * * *